(12) United States Patent
Ikeya

(10) Patent No.: US 6,413,888 B1
(45) Date of Patent: Jul. 2, 2002

(54) METHOD AND APPARATUS FOR PREVENTING RAPID TEMPERATURE VARIATION OF WAFERS DURING PROCESSING

(75) Inventor: Masahisa Ikeya, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/206,235

(22) Filed: Dec. 7, 1998

(30) Foreign Application Priority Data

Dec. 10, 1997 (JP) .............................. 9-339648

(51) Int. Cl.[7] ..................... H01L 21/324; H01L 21/477
(52) U.S. Cl. ..................... 438/799; 438/542; 438/550
(58) Field of Search ..................... 438/799, 542, 438/550; 219/444.1, 443.1, 385

(56) References Cited

U.S. PATENT DOCUMENTS

| 4,604,572 A | * | 8/1986 | Horiuchi et al. ............. 324/760 |
| 4,775,776 A | * | 10/1988 | Rahn et al. ................. 219/388 |
| 4,778,382 A | * | 10/1988 | Sakashita ................... 432/239 |
| 5,302,209 A | * | 4/1994 | Maeda et al. ............... 118/719 |
| 5,976,258 A | * | 11/1999 | Kleiner ....................... 118/718 |

FOREIGN PATENT DOCUMENTS

| JP | 3-95952 | * | 4/1991 |
| JP | 4-32226 | * | 2/1992 |
| JP | 404032226 A | * | 2/1992 |
| JP | 4-277618 A | * | 10/1992 |
| JP | 5-283501 | * | 10/1993 |
| JP | 09298204 A | * | 11/1997 |
| JP | 9-298204 A | * | 11/1997 |

* cited by examiner

Primary Examiner—Michael J. Sherry
Assistant Examiner—Evan Pert
(74) Attorney, Agent, or Firm—Volentine Francos, PLLC

(57) ABSTRACT

In a method for fabricating a semiconductor device, a semiconductor wafer is thermally treated with a wafer treatment device, such as in a diffustion process. The semiconductor wafer is deliverd to the treatment device using a conveyor system. The conveyor system is operated in an arrangement consisting of at least two connected armatures and is operated with both heating and cooling elements. The heating and cooling element are implemented for optimal temperture control of the connected conveyor arms with respect to increase throughout while avoiding thermal shock.

18 Claims, 20 Drawing Sheets

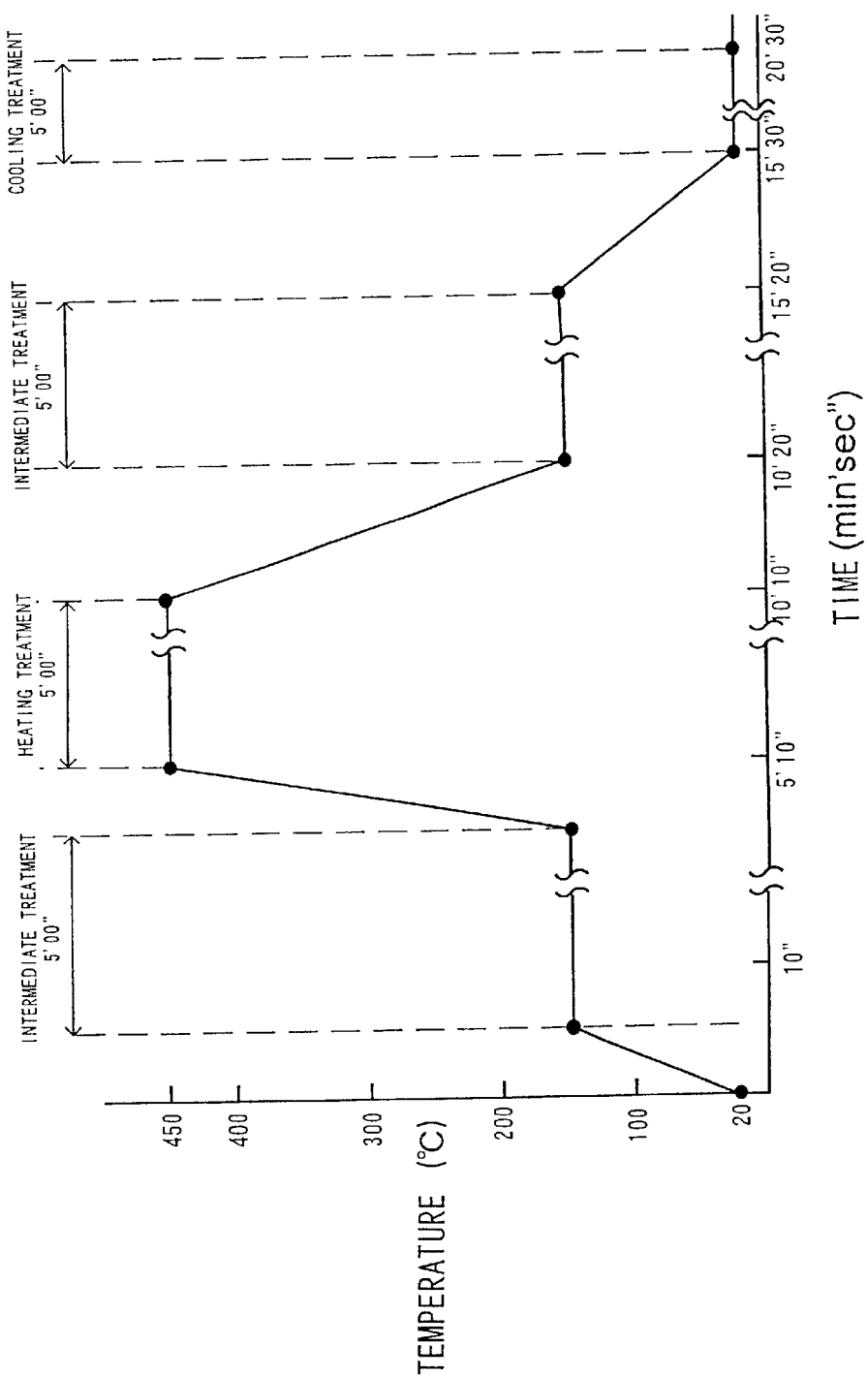

METHOD AND APPARATUS FOR PREVENTING RAPID TEMPERATURE VARIATION OF WAFERS DURING PROCESSING

CROSS REFERENCE TO RELATED APPLICATION

This application claims priority of Application No. H09-339648, filed Dec. 10, 1997 in Japan, the subject matter of which is incorporated herein by reference.

TECHNICAL FIELD OF THE INVENTION

The present invention relates to a method and an apparatus for fabricating a semiconductor device. More particularly, the present invention is directed to a method and an apparatus for fabricating a semiconductor device, in which a semiconductor wafer is delivered by a conveyer to a wafer treatment device and is thermally treated.

BACKGROUND OF THE INVENTION

In a process for fabricating a semiconductor device, a semiconductor wafer is thermally treated. For example, in a diffusion process, an electrode formed on a compound semiconductor wafer is sintered.

A conventional sinter furnace includes a heating chamber, in which a semiconductor wafer is heated, and a cooling chamber, in which the semiconductor wafer is cooled down. In such a conventional sinter furnace, a semiconductor wafer is conveyed by a delivery arm, between a loader cassette and the heating chamber; between the heating chamber and the cooling chamber; and between the cooling chamber and an un-loader cassette.

Semiconductor wafers contained in the loader cassette are controlled in temperature at about 20° C. The heating chamber includes a hot plate controlled in temperature at 450° C. The cooling chamber includes a cooling plate controlled in temperature at 20° C.

According to the conventional apparatus, a semiconductor wafer of the room temperature is rapidly heated up when the wafer is put onto the heating plate in the heating chamber. The temperature of the semiconductor wafer changes too rapidly, and therefore, the semiconductor wafer may be broken by heat-shock phenomenon. In addition, a semiconductor wafer, which has been heated in the heating chamber, is rapidly cooled down when the wafer is taken out from the heating chamber. That is because the delivery arm is at the room temperature of about 20° C., which is 430° C. different from the semiconductor wafer, which has been already heated. As a result, the semiconductor wafer may be broken by cool-shock phenomenon. Once a semiconductor wafer is broken, semiconductor devices formed thereon can not be used anymore. The above-described problems are remarkable and more serious to compound type of semiconductor wafers, such as GaAs wafers.

SUMMARY OF THE INVENTION

Accordingly, an object of the present invention is to provide a method for fabricating a semiconductor device in which a semiconductor wafer is prevented from being broken, caused by rapid temperature variation.

Another object of the present invention is to provide an apparatus for fabricating a semiconductor device in which a semiconductor wafer is prevented from being broken, caused by rapid temperature variation.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

According to a first aspect of the present invention, a method for fabricating a semiconductor device includes the steps of: thermally treating a semiconductor wafer with a wafer treatment device; delivering the semiconductor wafer by conveyer to the wafer treatment device; and controlling the temperature of the conveyer to have an optimum temperature.

According to a second aspect of the present invention, an apparatus for fabricating a semiconductor device, includes a wafer treatment device which applies a thermal treatment to a semiconductor wafer; a conveyer which delivers the semiconductor wafer to and from the wafer treatment device; and a controller which controls the temperature of the conveyer to have an optimum temperature.

As described above, according to the present invention, the conveyer is controlled in temperature, therefore, it can be avoided that the temperature of the semiconductor wafer is changed too rapidly. As a result, the semiconductor wafer is prevented from being broken due to heat-shock (rapid heating) or cool-shock (rapid cooling).

BRIEF DESCRIPTION OF THE DRAWINGS

FIG. 20 is a graph showing the temperature variation of a semiconductor wafer, which is processed in the sinter furnace according to the fourth preferred embodiment of the present invention.

DETAILED DESCRIPTION OF THE PREFERRED EMBODIMENTS

Figure 1:
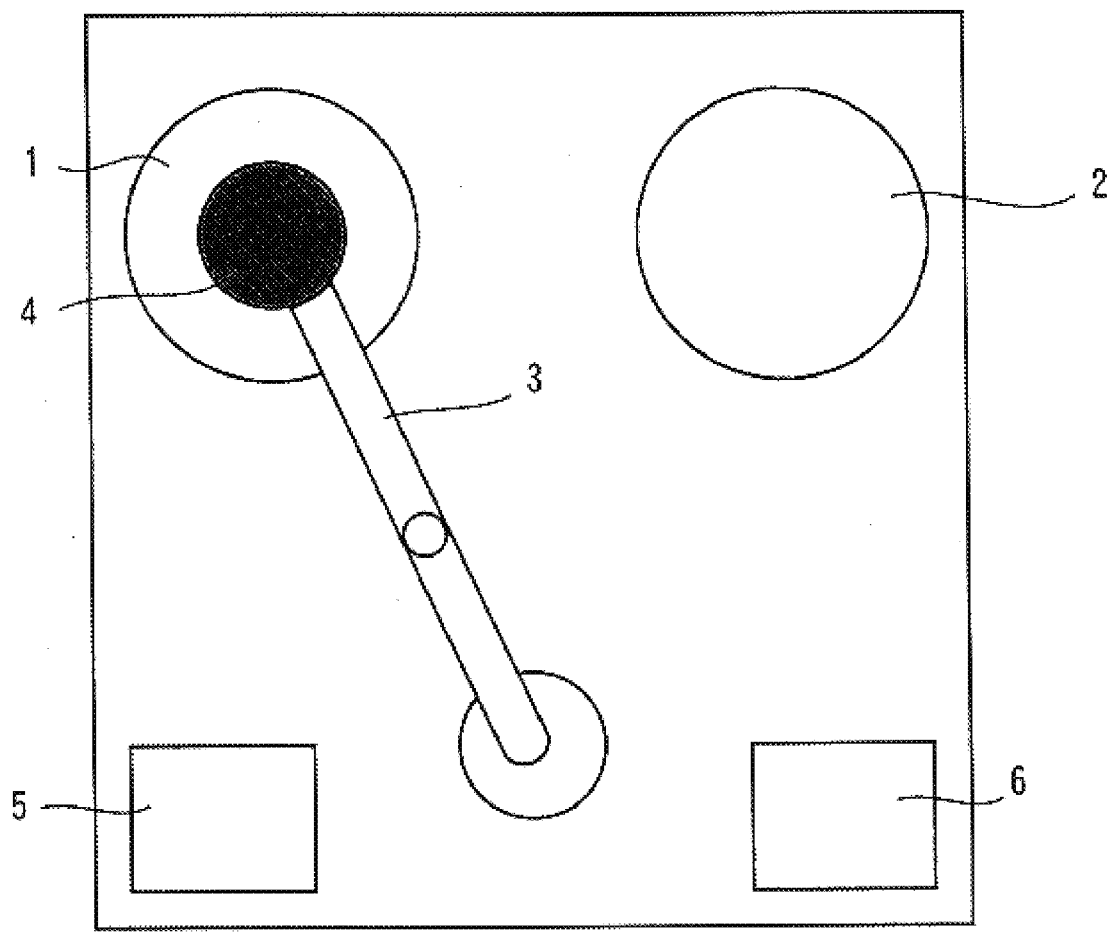
FIG. 1 is a plan view illustrating a conventional sinter furnace.

For better understanding of the present invention, a conventional technology is first described. FIG. 1 depicts a conventional sinter furnace, which includes a heating chamber 1, a cooling chamber 2, a conveying arm 3, a loader cassette 5 and an unloader cassette 6. In the heating chamber 1, a GaAs semiconductor wafer 4 is heated on a hot plate, kept at 450° C., in a nitrogen gas atmosphere. In the cooling chamber 2, the semiconductor wafer 4 is cooled by a cool plate, kept at 20° C., in a nitrogen gas atmosphere. The semiconductor wafer 4 is delivered by the conveying arm 3, which is made of SUS. In the loader cassette 5 and the un-loader cassette 6, semiconductor wafers have the room temperature of about 20° C.

Figure 2:
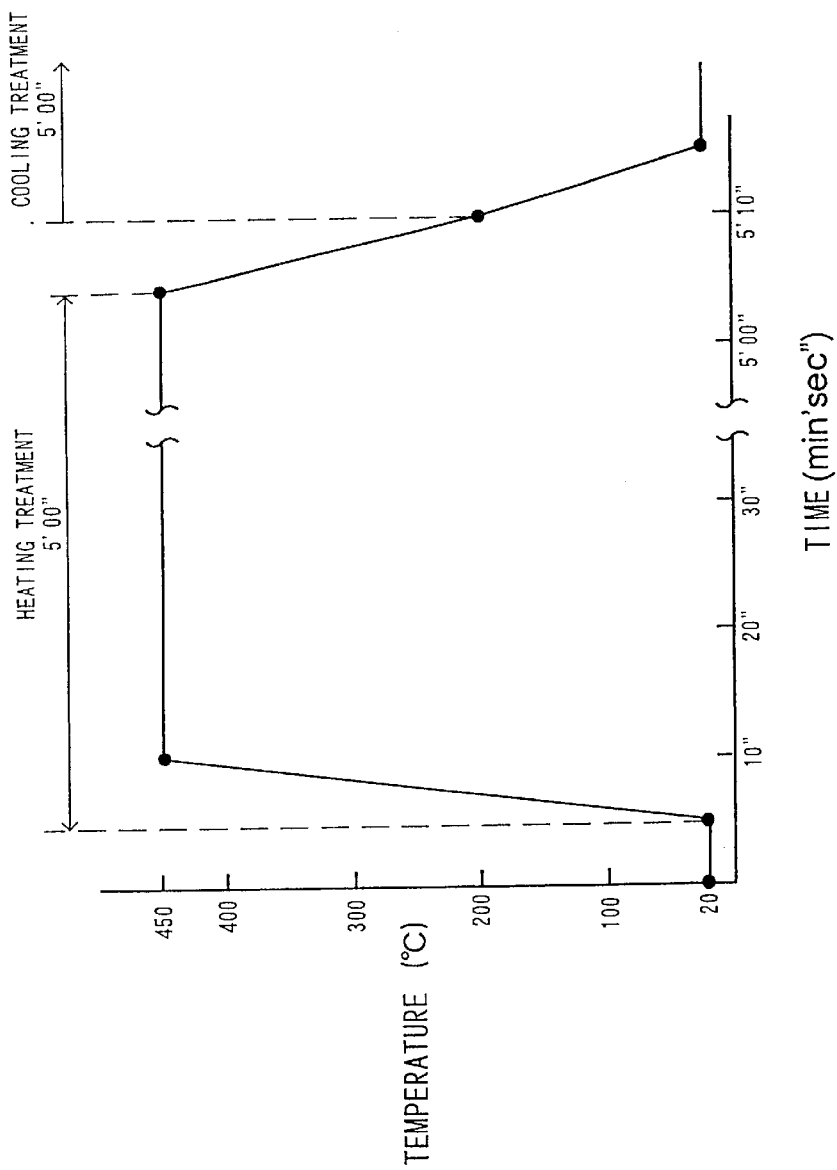
FIG. 2 is a graph showing temperature variation of a semiconductor wafer that is processed in the conventional sinter furnace.

FIG. 2 is a graph showing temperature variation of the semiconductor wafer 4, which is processed by the conventional sinter furnace. When a semiconductor wafer 4 is conveyed by the conveying arm 3 from the loader cassette 5 to the heating chamber 1, the semiconductor wafer 4 is heated in the heating chamber 1 for five minutes. The instant the semiconductor wafer 4 is put on the hot plate (not shown) in the heating chamber 1, the semiconductor wafer 4 is rapidly heated to 450° C., as shown in FIG. 2.

After the heating treatment, the semiconductor wafer 4 is conveyed by the conveying arm 3 from the heating chamber 1 to the cooling chamber 2. The instant the semiconductor wafer 4 is in touch with the conveying arm 3 of the room temperature, the semiconductor wafer 4 is rapidly cooled down, because the conveying arm 3 is more than 400° C. different in temperature from the semiconductor wafer 4, which has been heated to 450° C.

According to the conventional apparatus, the semiconductor wafer 4 of the room temperature is rapidly heated up when the wafer is put onto the hot plate in the heating chamber 1, and therefore, the semiconductor wafer 4 may be broken by heat-shock phenomenon. In addition, a wafer, which has been heated in the heating chamber 1, is rapidly cooled down when the wafer is picked up with the conveying arm 3. As a result, the wafer may be broken by cool-shock phenomenon. Once a semiconductor wafer is broken, semiconductor devices formed on the wafer can not be used anymore.

Figure 3:
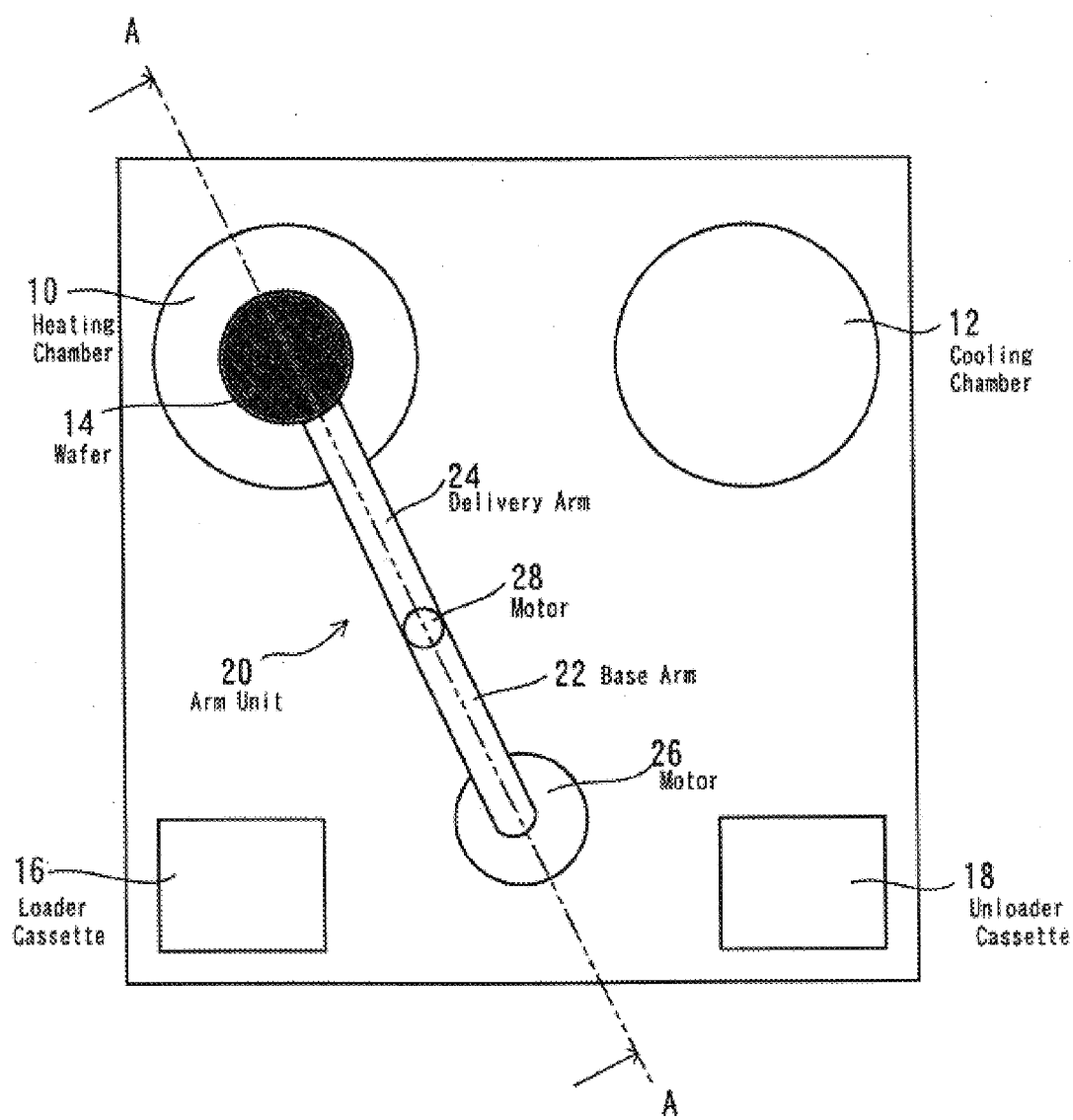
FIG. 3 is a plan view illustrating a sinter furnace according to a first preferred embodiment of the present invention.
Figure 4:
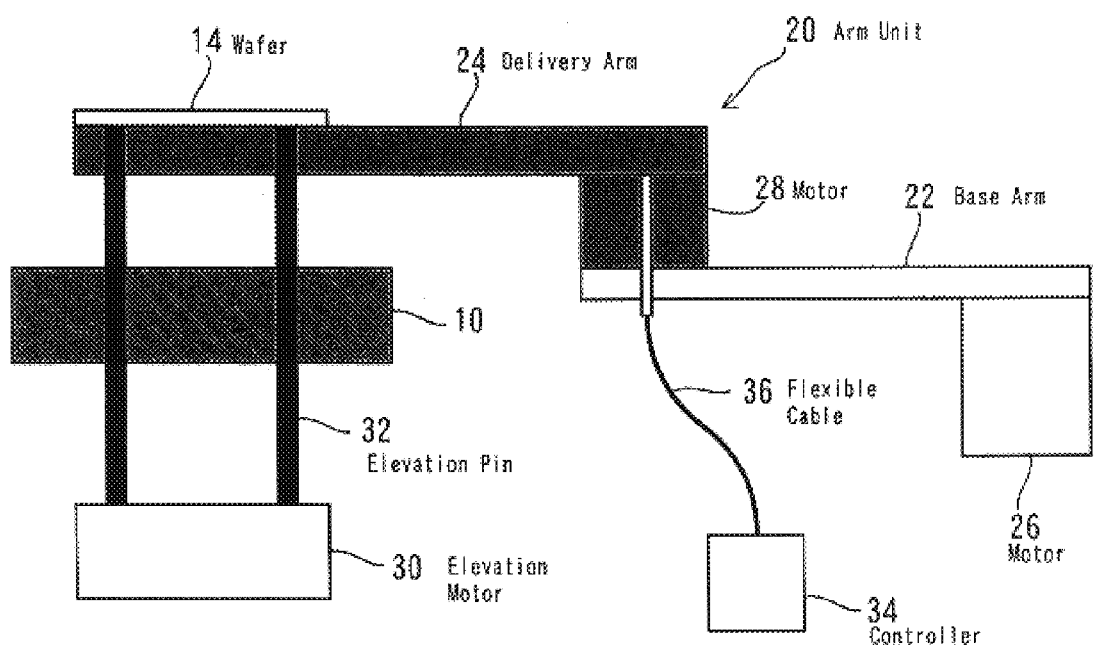
FIG. 4 is a cross-sectional view taken on line A—A of FIG. 3.

FIG. 3 depicts a sinter furnace according to a first preferred embodiment of the present invention. FIG. 4 shows the cross-section taken on line A—A of FIG. 3. The sinter furnace includes a heating chamber 10, a cooling chamber 12, a conveying arm unit 20, a loader cassette 16 and an un-loader cassette 18. In the heating chamber 10, a GaAs semiconductor wafer 14 is heated on a hot plate (not shown), which is kept at 450° C., in a nitrogen gas atmosphere. In the cooling chamber 12, the semiconductor wafer 14 is cooled on a cool plate (not shown), which is kept at 20° C., in a nitrogen gas atmosphere. During sintering process, the semiconductor wafer 14 is delivered by the conveying arm unit 20, which is made of SUS. In the loader cassette 16 and the un-loader cassette 18, semiconductor wafers have the room temperature of about 20° C.

The arm unit 20 includes a base arm 22, a delivery arm 24 and rotation motors 26 and 28. The motor 26 is connected to one end of the base arm 22 and turns (swings or pivots) the base arm 22 on the axis thereof. The motor 28 is connected to the other end of the base arm 22 and to one end of the delivery arm 24 and turns (swings or pivots) the delivery arm 24 on the axis thereof. The semiconductor wafer 14 is placed on the other end of the delivery arm 24. The delivery arm 24 is connected to a controller 34 via a flexible cable 36. The base arm 22 and the delivery arm 24 are driven independently from each other, so that the semiconductor wafer 14 can be delivered by the delivery arm 24.

As shown in FIG. 4, the heating chamber 10 is provided with an elevation motor 30 and elevation pins 32. The elevation pins 32 extend vertically through the heating chamber 10 to reach the bottom surface of the semiconductor wafer 14. The elevation motor 30 drives the elevation pins 32 up and down so that the semiconductor wafer 14 is delivered between the delivery arm 24 and the hot plate (not shown) in the heating chamber 10. In the same manner as the heating chamber 10, the cooling chamber 12 is provided with an elevation motor (not shown) and elevation pins (not shown), as well.

Figure 5:
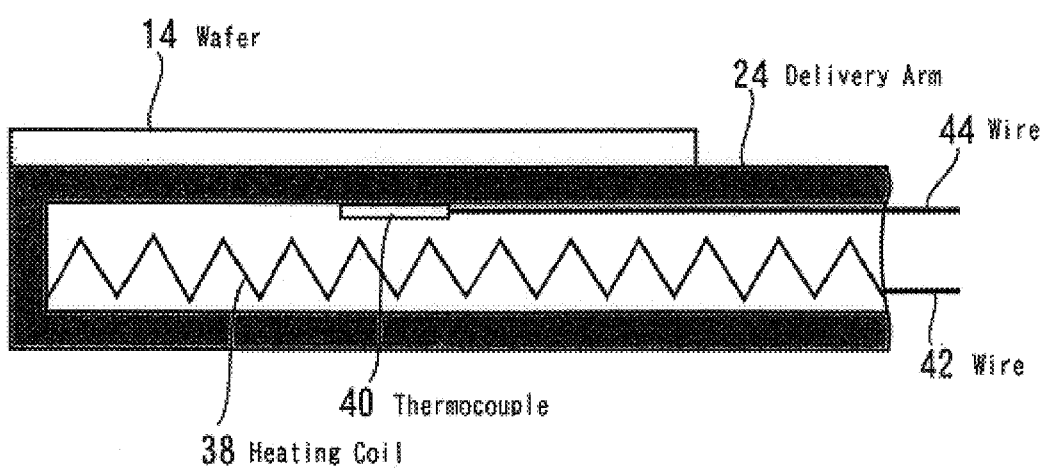
FIG. 5 is a cross-sectional view showing the inside of a delivery arm used in the sinter furnace of the first preferred embodiment.

FIG. 5 depicts the inside structure of the delivery arm 24 according to the first preferred embodiment of the present invention. The delivery arm 24 is provided therein with a heating coil 38 and a thermocouple 40. The heating coil 38 is connected via a flexible wire 42 to the controller 34, shown in FIG. 4. The thermocouple 40 is connected via a flexible wire 44 to the controller 34. The wires 42 and 44 are included in the flexible cable 36 so that the flexible wires 42 and 44 do not block the passage of the base arm 22 and the delivery arm 24.

The heating coil 38 generates heat in response to electric current supplied from the controller 34 through the flexible wire 42, so that the delivery arm 24 is heated to about 200° C. Basically, the delivery arm 24 is controlled in temperature at 200° C. throughout the sintering process. The thermocouple 40 detects the temperature of the delivery arm 24 and supplies the corresponding output signal to the controller 34 through the flexible wire 44. In response to the output signal of the thermocouple 40, the controller 34 controls the amount of current to be supplied through the flexible wire 42 to the heating coil 38, so that the delivery arm 24 is controlled at an optimum temperature (200° C.).

Figure 6:
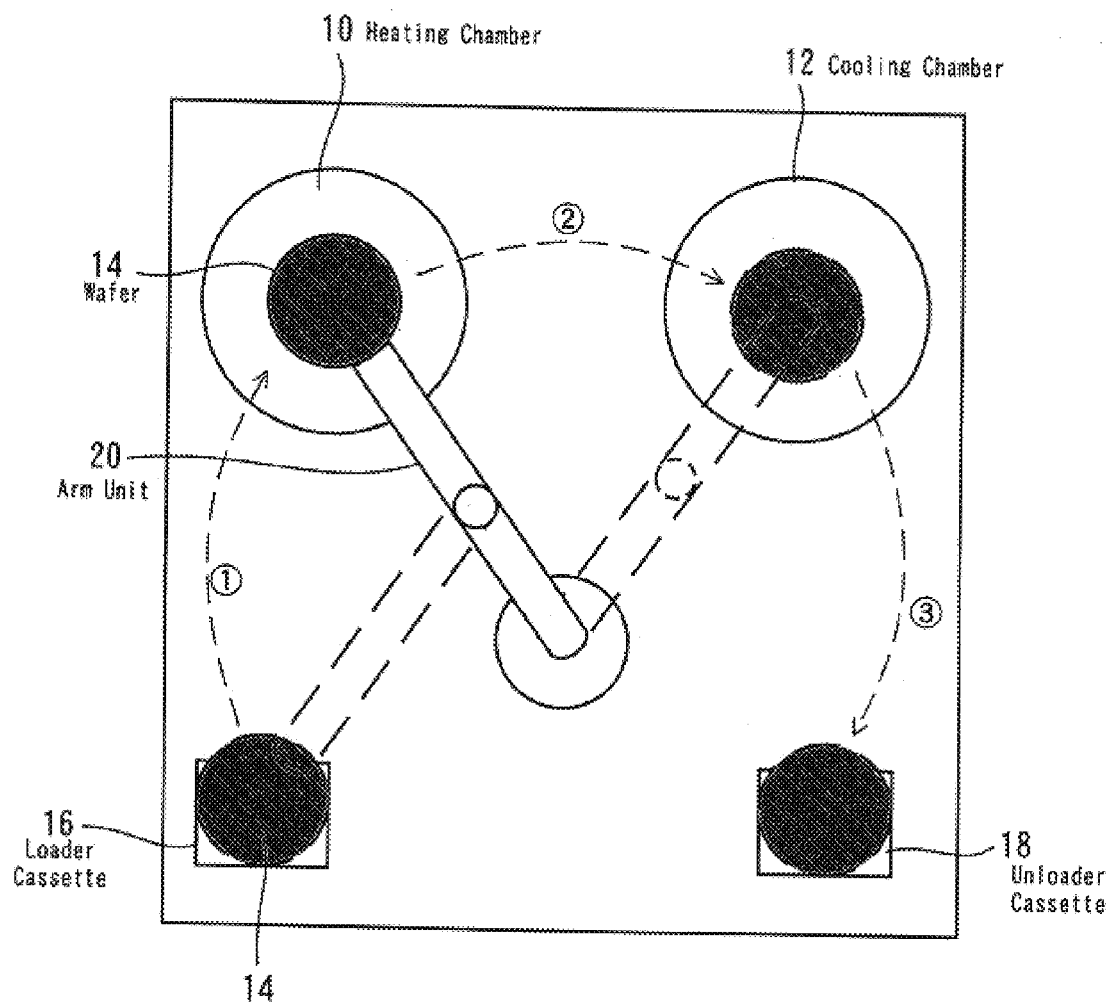
FIG. 6 is an explanatory diagram showing the operation of an arm unit used in the sinter furnace of the first preferred embodiment.
Figure 7:
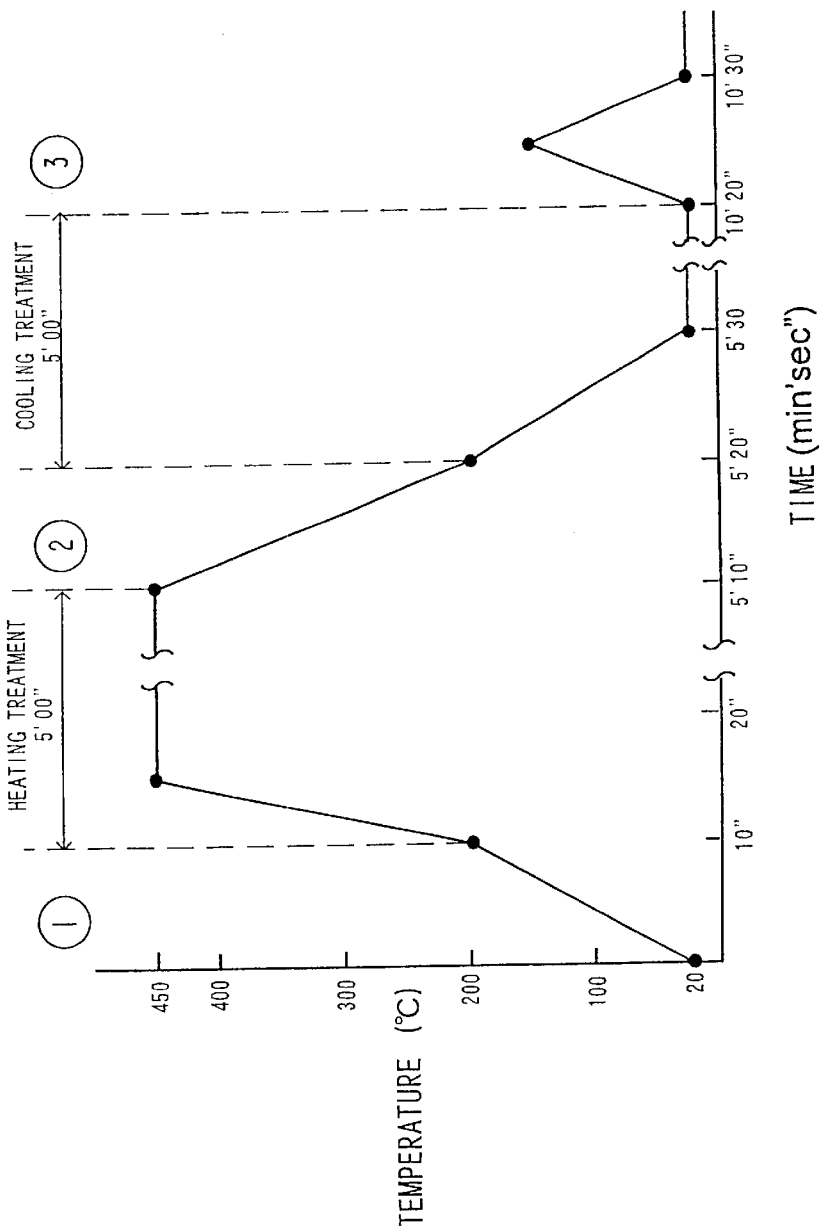
FIG. 7 is a graph showing temperature variation of a semiconductor wafer that is processed in the sinter furnace of the first preferred embodiment.

FIG. 6 shows the route along which the semiconductor wafer 14 is delivered, according to the first preferred embodiment of the present invention. FIG. 7 is a graph showing temperature variation of the semiconductor wafer 14, which is processed in the sinter furnace of the first preferred embodiment of the present invention. When the semiconductor wafer 14 is picked up with the delivery arm 24 from the loader cassette 16, the semiconductor wafer 14 is delivered toward the heating chamber 10. During the delivery of the semiconductor wafer 14 between the loader cassette 16 and the heating chamber 10, as indicated by a broken line of ①, the semiconductor wafer 14 is pre-heated to 150–200° C. on the delivery arm 24. The delivery arm 24 delivers the semiconductor wafer 14 relatively slowly so that the semiconductor wafer 14 is sufficiently pre-heated.

When the delivery arm 24 is positioned above the heating chamber 10, the elevation motor 30 moves the elevation pins 32 up so as to reach the semiconductor wafer 14, and the delivery arm 24 slides back so as not to block the passage of the semiconductor wafer 14. When the delivery arm 24 is completely apart from the heating chamber 10, the elevation motor 30 moves the elevation pins 32 down so that the semiconductor wafer 14 is set on the hot plate in the heating chamber 10. The semiconductor wafer 14 is heated on the hot plate (not shown) of 450° C. in a nitrogen gas atmosphere for five minutes. When the semiconductor wafer 14 is placed on the hot plate, the semiconductor wafer 14 has been already heated to 150–200° C. As a result, the semiconductor wafer 14 is not heated too rapidly to 450° C., as shown in FIG. 7. Therefore, it is avoided that the semiconductor wafer 14 is broken due to heat-shock phenomenon.

After the heating treatment in the heating chamber 10, the elevation motor 30 moves the elevation pins 32 up so that the elevation pins 32 lift the semiconductor wafer 14 apart from the heating chamber 10. When the semiconductor wafer 14 is lifted up from the heating chamber 10, the delivery arm 24 is slid under the semiconductor wafer 14, then the elevation pins 32 goes down so that the semiconductor wafer 14 is placed on the delivery arm 24. When the semiconductor wafer 14 of 450° C. is in touch with the delivery arm 24 of 200° C., the semiconductor wafer 14 is cooled down to around 150 to 200° C. Because the temperature difference between the semiconductor wafer 14 and the delivery arm 24 is about 250° C., the semiconductor wafer 14 is not cooled down too rapidly. Therefore, it is avoided that the semiconductor wafer 14 is broken due to cool-shock phenomenon.

Next, the semiconductor wafer 14 is delivered by the delivery arm 24 from the heating chamber 10 to the cooling chamber 12, as indicated by a broken line of ②. In the cooling chamber 12, the semiconductor wafer 14 is cooled down on the cool plate of 20° C. The cooling treatment is carried out for five minutes in a nitrogen gas atmosphere. After the cooling treatment, the delivery arm 24 picks up the semiconductor wafer 14 and delivers it to the un-loader cassette 18, as indicated by a broken line of ③. In the cooling chamber 12, the semiconductor wafer 14 is conveyed between the delivery arm 24 and the cool plate in the same manner as the heating chamber 10.

As described above, according to the first preferred embodiment of the present invention, the delivery arm 24 is controlled in temperature, therefore, it can be avoided that the temperature of the semiconductor wafer 14 is changed too rapidly. As a result, the semiconductor wafer 14 is prevented from being broken due to heat-shock (rapid heating) or cool-shock (rapid cooling).

Figure 8:
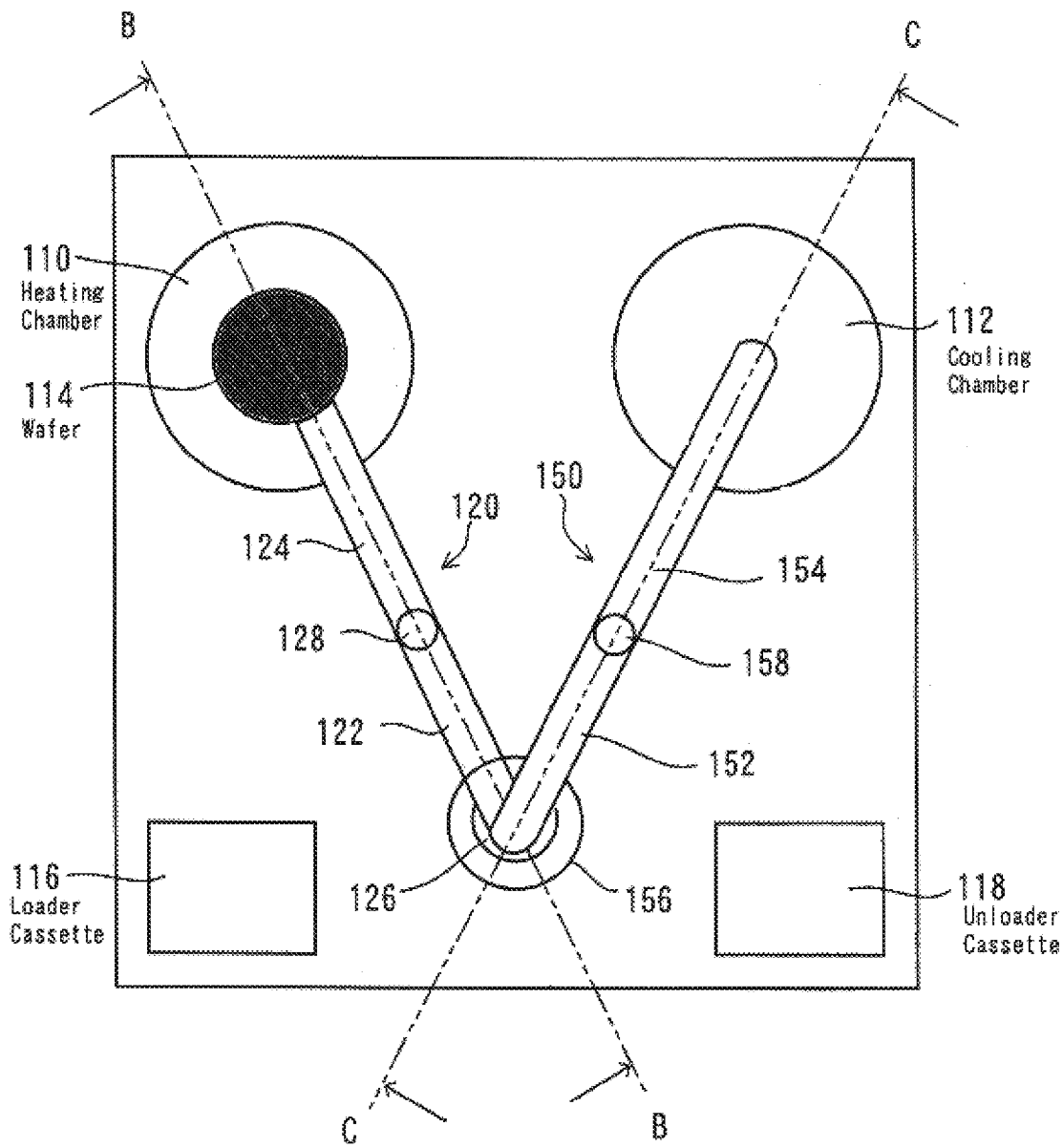
FIG. 8 is a plan view illustrating a sinter furnace according to a second preferred embodiment of the present invention.
Figure 9:
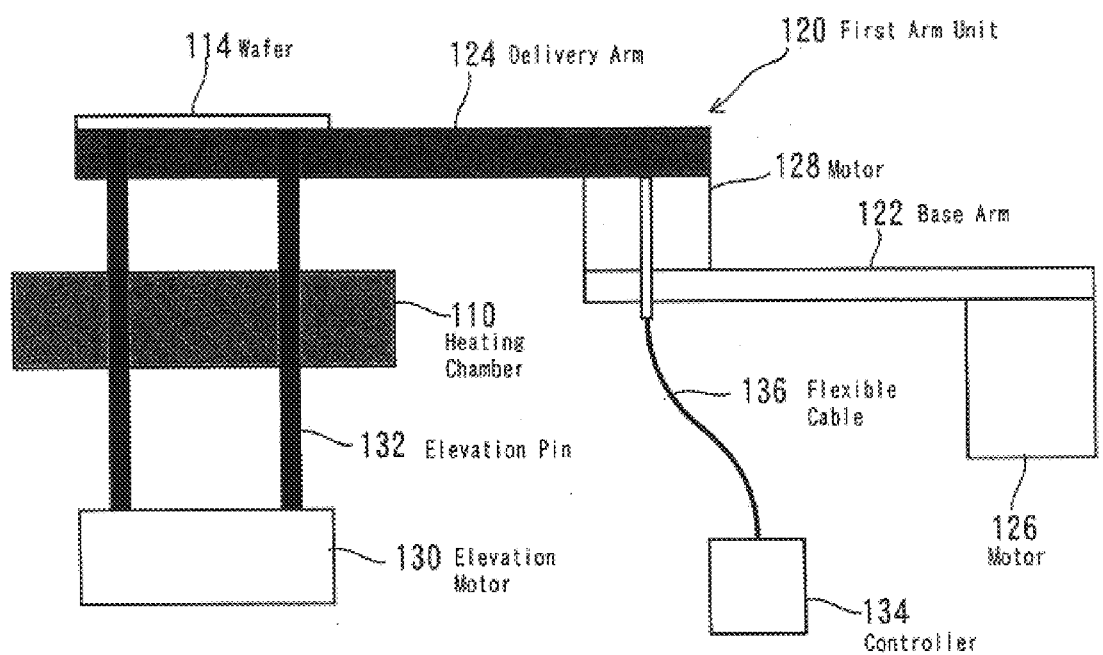
FIG. 9 is a cross-sectional view taken on line B—B in FIG. 8.
Figure 10:
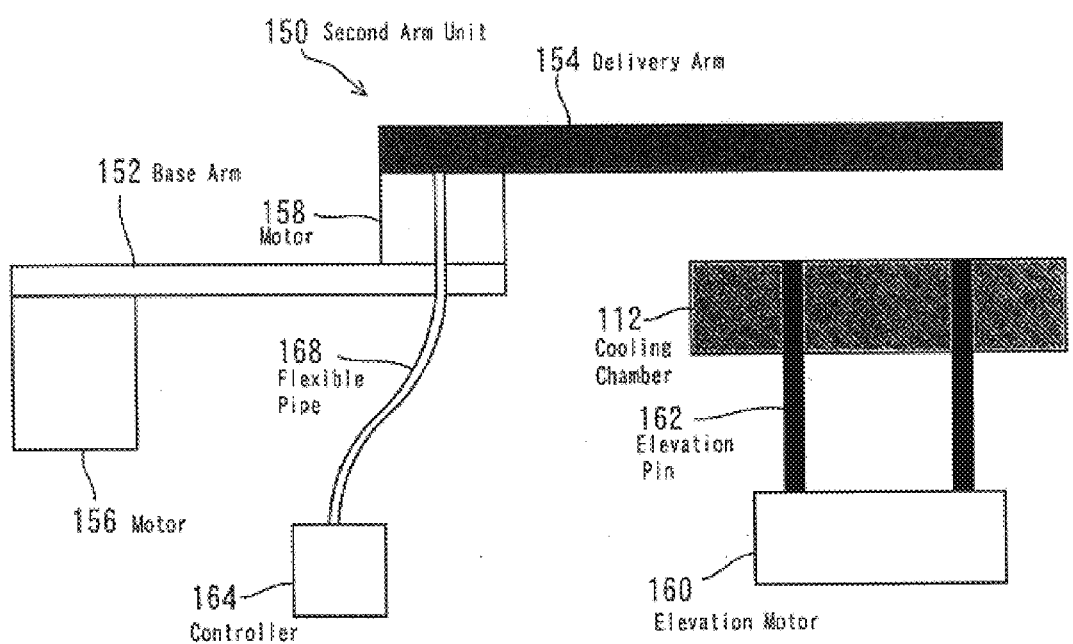
FIG. 10 is a cross-sectional view taken on line C—C in FIG. 8.

FIG. 8 depicts a sinter furnace according to a second preferred embodiment of the present invention. FIG. 9 is a cross-sectional view taken on line B—B in FIG. 8. FIG. 10 is a cross-sectional view taken on line C—C in FIG. 8. The sinter furnace of the second preferred embodiment includes a heating chamber 110, a cooling chamber 112, a first conveying arm unit 120, a second conveying arm unit 150, a loader cassette 116 and an un-loader cassette 118. In the heating chamber 110, a GaAs semiconductor wafer 114 is heated on a hot plate (not shown), which is kept at 450° C.,
in a nitrogen gas atmosphere. In the cooling chamber 112, the semiconductor wafer 114 is cooled on a cool plate (not shown), which is kept at 20° C., in a nitrogen gas atmosphere. During sintering process, the semiconductor wafer 114 is delivered by the first and second conveying arm units 120 and 150, which are made of SUS. In the loader cassette 116 and the un-loader cassette 118, semiconductor wafers have the room temperature of about 20° C.

The first arm unit 120 includes a base arm 122, a delivery arm 124 and motors 126 and 128. The motor 126 is connected to one end of the base arm 122 and turns (swings or pivots) the base arm 122 on the axis thereof. The motor 128 is connected to the other end of the base arm 122 and to one end of the delivery arm 124 and turns (swings or pivots) the delivery arm 124 on the axis thereof. The semiconductor wafer 114 is placed on the other end of the delivery arm 124. The delivery arm 124 is connected to a controller 134 via a flexible cable 136. The base arm 122 and the delivery arm 124 are driven independently from each other, so that the semiconductor wafer 114 can be delivered only by the delivery arm 124.

The second arm unit 150 includes a base arm 152, a delivery arm 154 and motors 156 and 158. The motor 156 is connected to one end of the base arm 152 and turns (swings or pivots) the base arm 152 on the axis thereof. The motor 158 is connected to the other end of the base arm 152 and to one end of the delivery arm 154 and turns (swings or pivots) the delivery arm 154 on the axis thereof. The semiconductor wafer 114 is placed on the other end of the delivery arm 154. The delivery arm 154 is connected to a controller 164 via a flexible pipe 168. The base arm 152 and the delivery arm 154 are driven independently from each other, so that the semiconductor wafer 114 can be delivered only by the delivery arm 154.

As shown in FIG. 9, the heating chamber 110 is provided with an elevation motor 130 and elevation pins 132. The elevation pins 132 extend vertically through the heating chamber 110 to reach the bottom surface of the semiconductor wafer 114. The elevation motor 130 drives the elevation pins 132 up and down so that the semiconductor wafer 114 is carried between the delivery arm 124 and the hot plate (not shown) in the heating chamber 110.

As shown in FIG. 10, the cooling chamber 112 is provided with an elevation motor 160 and elevation pins 162. The elevation pins 162 extend vertically through the cooling chamber 112 to reach the bottom surface of the semiconductor wafer 114. The elevation motor 160 drives the elevation pins 162 up and down so that the semiconductor wafer 114 is carried between the delivery arm 124 and the cool plate (not shown) in the cooling chamber 112, and between the delivery arm 154 and the cool plate.

Figure 11:
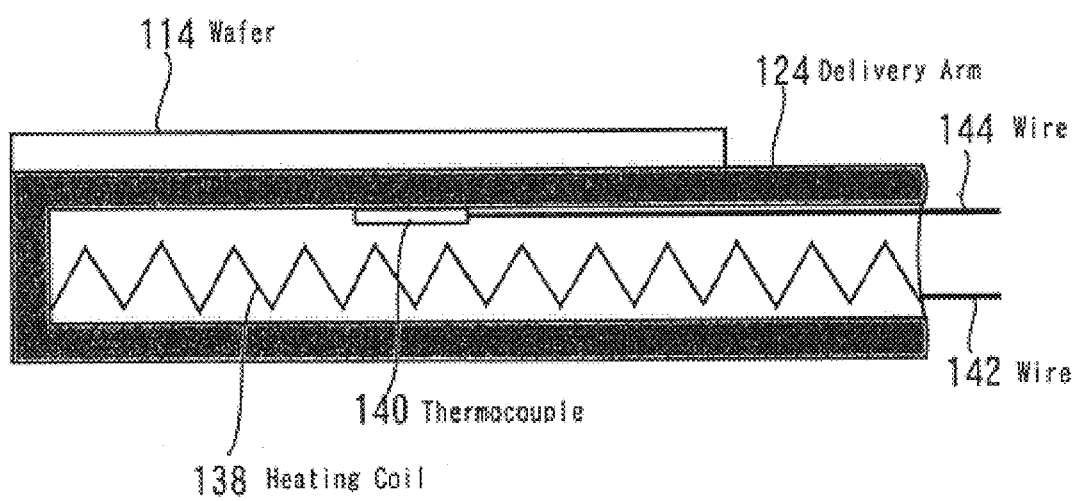
FIG. 11 is a cross-sectional view showing the inside of a delivery arm of a first arm unit used in the sinter furnace of the second preferred embodiment.

FIG. 11 depicts the inside structure of the delivery arm 124 of the first conveying arm unit 120 according to the second preferred embodiment of the present invention. The delivery arm 124 is provided therein with a heating coil 138 and a thermocouple 140. The heating coil 138 is connected via a flexible wire 142 to the controller 134, shown in FIG. 9. The thermocouple 140 is connected via a flexible wire 144 to the controller 134. The flexible wires 142 and 144 are included in the flexible cable 136 so that the flexible wires 142 and 144 do not block the passage of the base arm 122 and the delivery arm 124.

The heating coil 138 generates heat in response to electric current supplied from the controller 134 through the flexible wire 142, so that the delivery arm 124 is heated to about 200° C. The thermocouple 140 detects the temperature of the delivery arm 124 and supplies the corresponding output signal to the controller 134 through the flexible wire 144. In response to the output signal of the thermocouple 140, the controller 134 controls the amount of current to be supplied through the flexible wire 142 to the heating coil 138, so that the delivery arm 124 is controlled at an optimum temperature.

Figure 12:
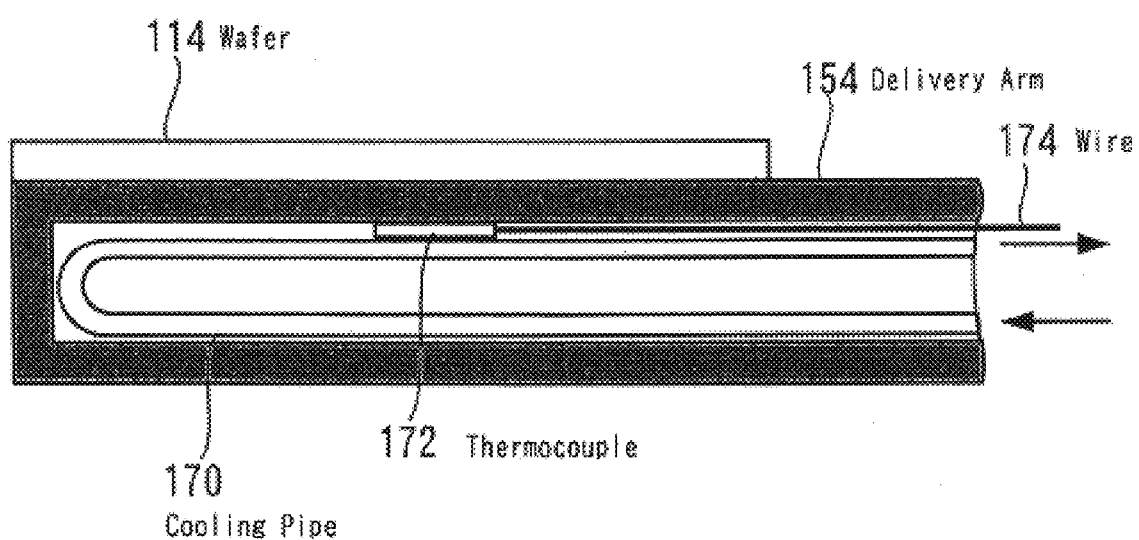
FIG. 12 is a cross-sectional view showing the inside of a delivery arm of a second arm unit used in the sinter furnace of the second preferred embodiment.

FIG. 12 depicts the inside structure of the delivery arm 154 of the second conveying arm unit 150 according to the second preferred embodiment of the present invention. The delivery arm 154 is provided therein with a cooling pipe 170 and a thermocouple 172. The cooling pipe 170 is connected via a flexible pipe 168 to the controller 164, as shown in FIG. 10. The thermocouple 172 is connected via a flexible wire 174 to the controller 164. The ends of the cooling pipe 170 and the flexible wire 174 are contained in the flexible pipe 164 so that the cooling pipe 170 and the flexible wire 172 do not block the passage of the base arm 152 and the delivery arm 154.

Cooling liquid, such as water, travels in the cooling pipe 170 so that the delivery arm 154 is controlled in temperature at about 20° C. The thermocouple 172 detects the temperature of the delivery arm 154 and supplies the corresponding output signal to the controller 164 through the flexible wire 174. In response to the output signal of the thermocouple 172, the controller 164 controls the temperature of the cooling liquid traveling in the cooling pipe 170, so that the delivery arm 154 is controlled at an optimum temperature.

Figure 13:
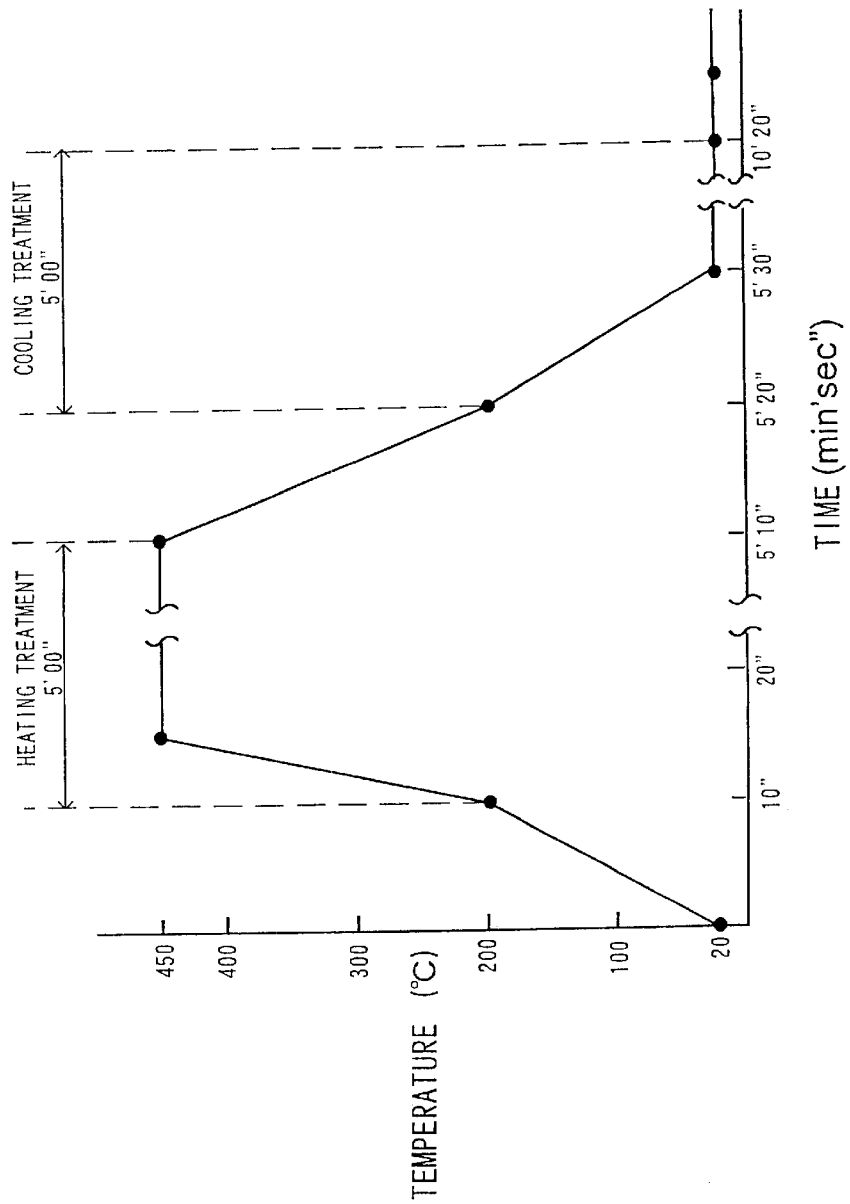
FIG. 13 is a graph showing temperature variation of a semiconductor wafer that is processed in the sinter furnace of the second preferred embodiment.

FIG. 13 is a graph showing temperature variation of the semiconductor wafer 114, which is processed in the sinter furnace according to the second preferred embodiment of the present invention. In this embodiment, the first conveying arm unit 120 is used for conveying the semiconductor wafer 114 between the loader cassette 116 and the heating chamber 110, and between the heating chamber 110 and the cooling chamber 112. On the other hand, the second conveying arm unit 150 is used for conveying the semiconductor wafer 114 between the cooling chamber 112 and the un-loader cassette 118.

In operation, the semiconductor wafer 114 is picked up with the delivery arm 124 of the first conveying arm unit 120 from the loader cassette 116, and delivered toward the heating chamber 110. During the delivery of the semiconductor wafer 114 between the loader cassette 116 and the heating chamber 110, the semiconductor wafer 114 is pre-heated to 150–200° C. on the delivery arm 124. The delivery arm 124 delivers the semiconductor wafer 114 relatively slowly so that the semiconductor wafer 114 is pre-heated enough.

When the delivery arm 124 is positioned just above the heating chamber 110, the elevation motor 130 moves the elevation pins 132 up so as to reach the semiconductor wafer 114, and the delivery arm 124 slides back so as not to block the passage of the semiconductor wafer 114. When the delivery arm 124 is completely apart from the heating chamber 110, the elevation motor 130 moves the elevation pins 132 down so that the semiconductor wafer 114 is arranged on the hot plate (not shown) in the heating chamber 110. The semiconductor wafer 114 is heated on the hot plate (not shown) in a nitrogen gas atmosphere for five minutes. When the semiconductor wafer 114 is placed on the hot plate, the semiconductor wafer 114 has been already pre-heated to 150–200° C. As a result, the semiconductor wafer 114 is not heated too rapidly to 450° C., as shown in FIG. 13. Therefore, the semiconductor wafer 114 is prevented from being broken due to heat-shock phenomenon.

After the heating treatment in the heating chamber 110, the elevation motor 130 moves the elevation pins 132 up so that the elevation pins 132 lift up the semiconductor wafer 114 apart from the heating chamber 110. When the semiconductor wafer 114 is lifted up from the heating chamber 110, the delivery arm 124 is slid under the semiconductor wafer 114, then the elevation pins 132 go down so that the semiconductor wafer 114 is placed on the delivery arm 124. When the semiconductor wafer 114 of 450° C. is in touch with the delivery arm 124 of 200° C., the semiconductor wafer 114 is cooled down to around 150–200° C. Because the temperature difference between the semiconductor wafer 114 and the delivery arm 124 is about 250° C., the semiconductor wafer 114 is not cooled down too rapidly, Therefore, the semiconductor wafer 114 is prevented from being broken due to cool-shock phenomenon.

Next, the semiconductor wafer 114 is delivered by the delivery arm 124 from the heating chamber 110 to the cooling chamber 112.

When the delivery arm 124 is positioned above the cooling chamber 112, the elevation motor 160 moves the elevation pins 162 up so as to reach the semiconductor wafer 114, and the delivery arm 124 slides back so as not to block the passage of the semiconductor wafer 114. When the delivery arm 124 is completely apart from the cooling chamber 112, the elevation motor 160 moves the elevation pins 162 down so that the semiconductor wafer 114 is arranged on the cool plate (not shown) in the cooling chamber 112. The semiconductor wafer 114 is cooled on the cool plate (not shown) in a nitrogen gas atmosphere for five minutes.

After the cooling treatment, the elevation motor 160 moves the elevation pins 162 up so that the elevation pins 162 lift the semiconductor wafer 114 apart from the cooling chamber 112. When the semiconductor wafer 114 is lifted up from the cooling chamber 112, the delivery arm 154 of the second conveying arm unit 150 is slid under the semiconductor wafer 114. Then, the elevation pins 162 go down so that the semiconductor wafer 114 is placed on the delivery arm 154. In this case, the semiconductor wafer 114 of 20° C. is in touch with the delivery arm 154 of 20° C., so that there is no temperature difference between them. Therefore, the semiconductor wafer 114 is prevented from being broken due to cool-shock phenomenon.

Next, the semiconductor wafer 114 is delivered by the delivery arm 154 of the second conveying arm unit 150 to the un-loader cassette 118.

As described above, according to the second preferred embodiment of the present invention, the delivery arm 124 of the first conveying arm unit 120 is controlled in temperature at 200° C. Therefore, the semiconductor wafer 114 is prevented from being broken due to heat-shock (rapid heating) or cool-shock (rapid cooling).

Further, according to the second preferred embodiment of the present invention, the delivery arm 154 of the second conveying arm unit 150 is controlled in temperature at 20° C. Therefore, it can be avoided that the temperature of the semiconductor wafer 114 is changed too rapidly, when the semiconductor wafer 114 is conveyed from the cooling chamber 112 to the un-loader cassette 118.

Figure 14:
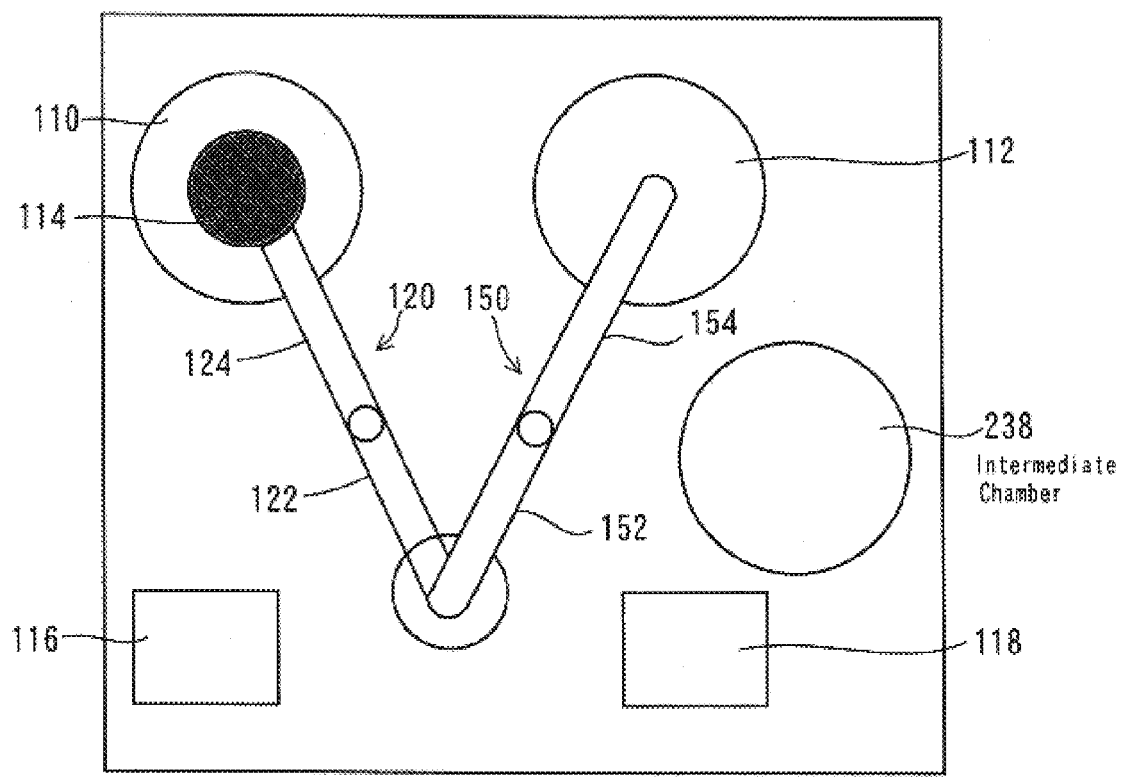
FIG. 14 is a plan view illustrating a sinter furnace according to a third preferred embodiment of the present invention.

FIG. 14 depicts a sinter furnace according to a third preferred embodiment of the present invention. The sinter furnace includes a heating chamber 110, a cooling chamber 112, a first conveying arm unit 120, a second conveying arm unit 150, an intermediate chamber 238, a loader cassette 116 and an un-loader cassette 118, In the heating chamber 110, a GaAs semiconductor wafer 114 is heated on a hot plate (not shown), which is kept at 450° C., in a nitrogen gas atmosphere. In the cooling chamber 112, the semiconductor wafer 114 is cooled on a cool plate (not shown), which is kept at 20° C., in a nitrogen gas atmosphere. During sintering process, the semiconductor wafer 114 is delivered by the first and second conveying arm units 120 and 150, which are made of SUS. In the loader cassette 116 and the un-loader cassette 118, semiconductor wafers have the room temperature of about 20° C.

The detailed structure of the first and second arm units 120 and 150, the heating chamber 110, the cooling chamber 112, the loader cassette 116 and the un-loader cassette 118 correspond to those in the second preferred embodiment, shown in FIGS. 8–12. The same description for those elements are not repeated.

The intermediate chamber 238 includes a heat plate controlled in temperature at 150° C., so that the semiconductor wafer 114 placed therein is pre-heated before the heating treatment of the heating chamber 110 and pre-cooling before the cooling treatment of the cooing chamber 112.

Figure 15:
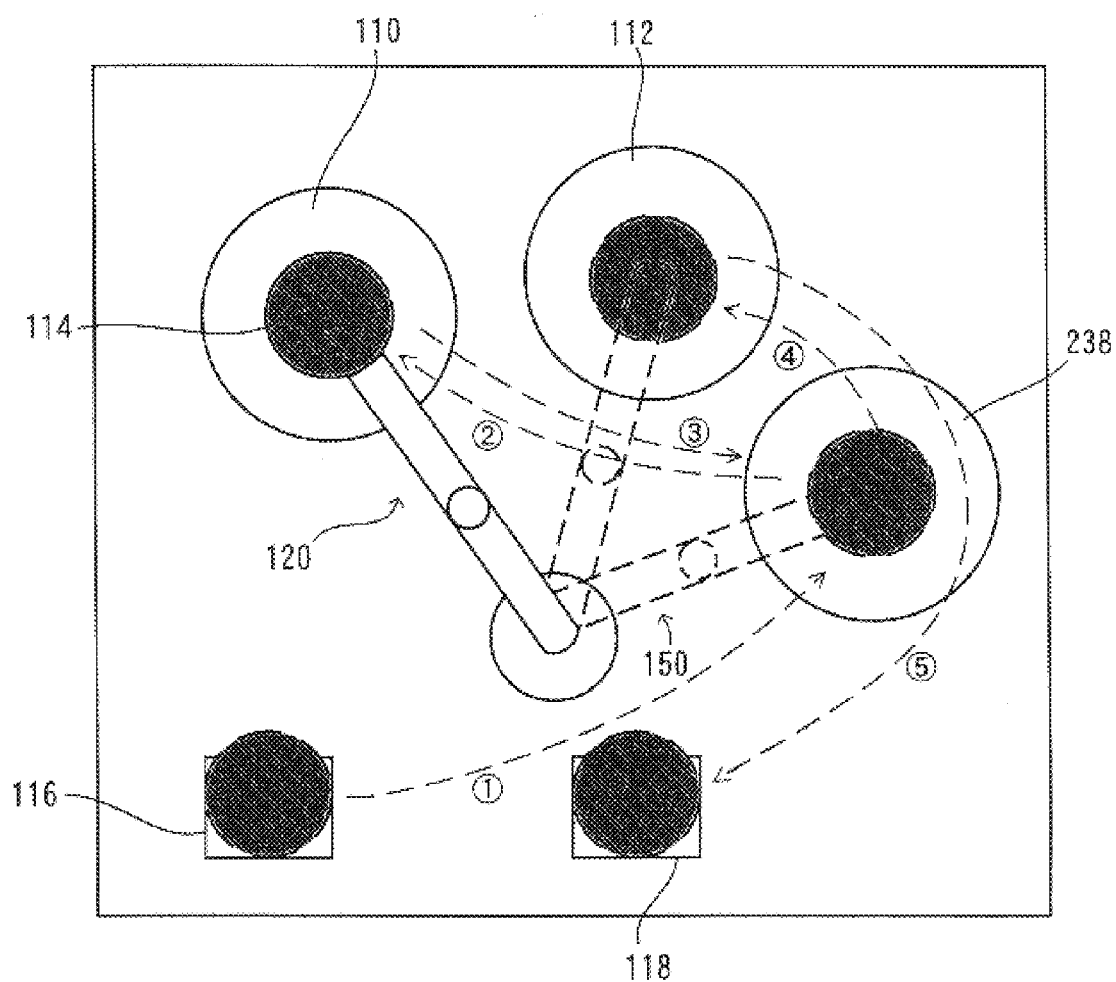
FIG. 15 is a diagram showing the operation of an arm unit used in the sinter furnace of the third preferred embodiment.
Figure 16:
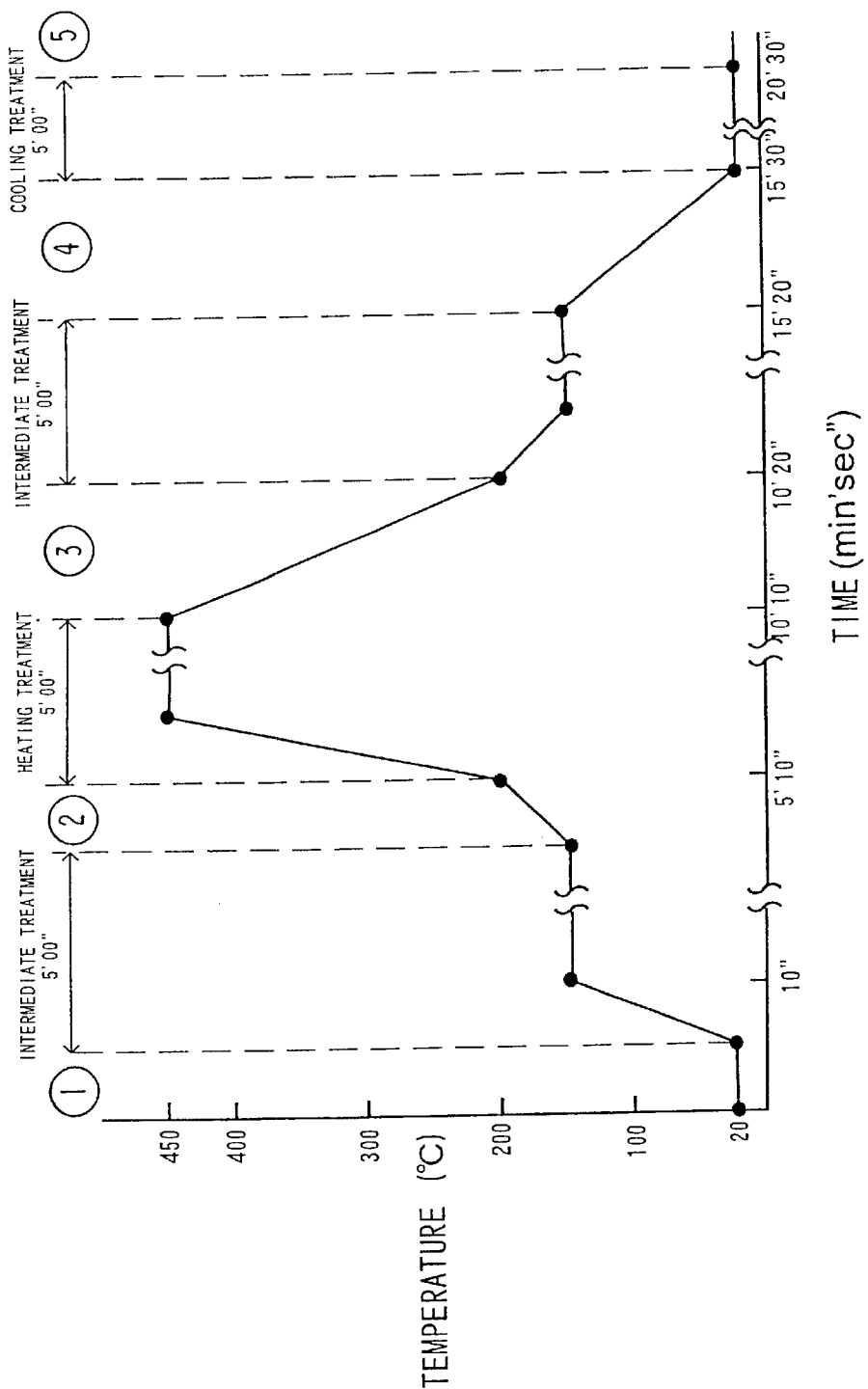
FIG. 16 is a graph showing temperature variation of a semiconductor wafer that is processed in the sinter furnace of the third preferred embodiment.

FIG. 15 shows the route along which the semiconductor wafer 114 is delivered in the sinter furnace according to the third preferred embodiment of the present invention. FIG. 16 shows temperature variation of the semiconductor wafer 114, which is processed in the sinter furnace according to the third preferred embodiment of the present invention.

In this embodiment, the first conveying arm unit 120, provided with the heating mechanism, is used for conveying the semiconductor wafer 114 between the intermediate chamber 238 and the heating chamber 110, as indicated by broken lines ② and ③. On the other hand, the second conveying arm unit 150, provided with the cooling mechanism, is used for conveying the semiconductor wafer 114 from the loader cassette 116 to the intermediate chamber 238, as indicated by a broken line ①; from the intermediate chamber 238 to the cooling chamber 112, as indicated by a broken line ④; and from the cooling chamber 112 to the un-loader cassette 118, as indicated by a broken line ⑤.

In operation, first, the semiconductor wafer 114 is delivered by the delivery arm 154 of the second conveying arm unit 150 from the loader cassette 116 to the intermediate chamber 238, as indicated by broken line ①. When the semiconductor 114 is placed on the delivery arm 154, the delivery arm 154 has been controlled at 20° C., which is corresponding to the current temperature of the semiconductor wafer 114. In the intermediate chamber 238, the semiconductor wafer 114 is gradually heated to 150° C. in a nitrogen gas atmosphere for five minutes.

Next, the first conveying arm unit 120 delivers the semiconductor wafer 114 from the intermediate chamber 238 to the heating chamber 110, as indicated by broken line ②. When the semiconductor wafer 114 is placed on the delivery arm 124, the temperature difference between them is about 50° C. In the heating chamber 110, the semiconductor wafer 114 is heated on the hot plate (not shown) in a nitrogen gas atmosphere for five minutes. When the semiconductor wafer 114 is placed on the hot plate of the heating chamber 110, the semiconductor wafer 114 has been already heated to 150–200° C. by the delivery arm 124 of the first conveying arm unit 120. As a result, the temperature difference between the semiconductor wafer 114 and the hot plate is 250–300° C. Therefore, the semiconductor wafer 114 is not heated too rapidly to 450° C., as shown in FIG. 16. The semiconductor wafer 114 is prevented from being broken due to heat-shock phenomenon.

After the heating treatment in the heating chamber 110, the first conveying arm unit 120 delivers the semiconductor wafer 114 to the intermediate chamber 238 again, as indicated by broken line ③. When the semiconductor wafer 114 of 450° C. is in touch with the delivery arm 124 of 200° C., the semiconductor wafer 114 is cooled down to around 150–200° C. Because the temperature difference between the semiconductor wafer 114 and the delivery arm 124 is about 250° C., the semiconductor wafer 114 is not cooled down too rapidly. Therefore, the semiconductor wafer 114 is prevented from being, broken due to cool-shock phenomenon.

In the intermediate chamber 238, the semiconductor wafer 114 is controlled in temperature at 150° C. When the semiconductor wafer 114 is set in the intermediate chamber 238, there is no temperature difference between them. After the intermediate treatment, the semiconductor wafer 114 is delivered by the second conveying arm unit 150 to the cooling chamber 112, as indicated by a broken line ④. In the cooling chamber 112, the semiconductor wafer 114 is cooled on the cool plate (not shown) in a nitrogen gas atmosphere for five minutes.

After the cooling treatment, the second conveying arm unit 150 delivers the semiconductor wafer 114 to the un-loader cassette 118, as indicated by broken line ⑤. In this case, the semiconductor wafer 114 of 20° C. is in touch with the delivery arm 154 of 20° C., so that no temperature difference is made between them. Therefore, the semiconductor wafer 114 is prevented from being broken due to cool-shock phenomenon.

As described above, according to the third preferred embodiment of the present invention, the same advantages as the first and second preferred embodiments can be obtained. That is, it can be avoided that the temperature of the semiconductor wafer 114 is changed too rapidly. As a result, the semiconductor wafer 114 is prevented from being broken due to heat-shock (rapid heating) or cool-shock (rapid cooling).

Figure 17:
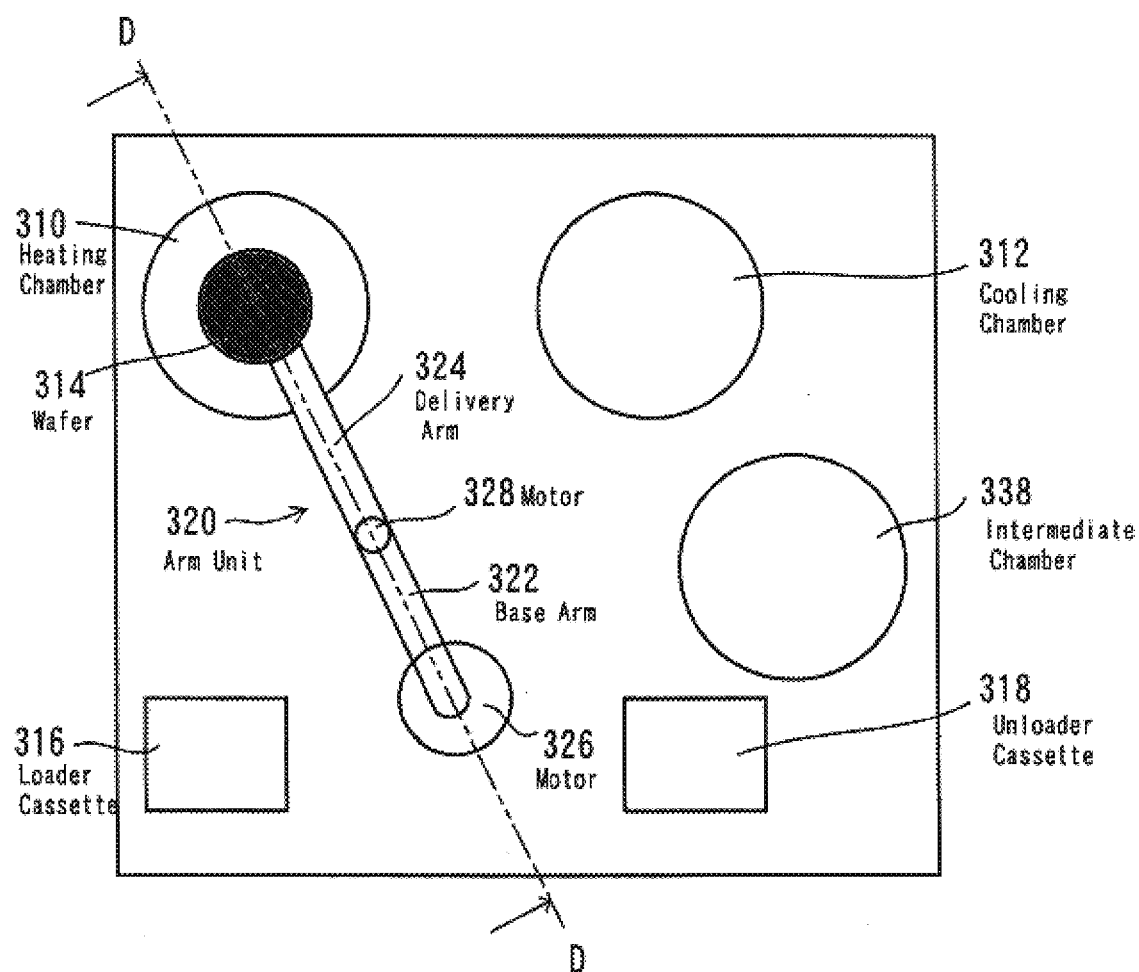
FIG. 17 is a plan view illustrating a sinter furnace according to a fourth preferred embodiment of the present invention.
Figure 18:
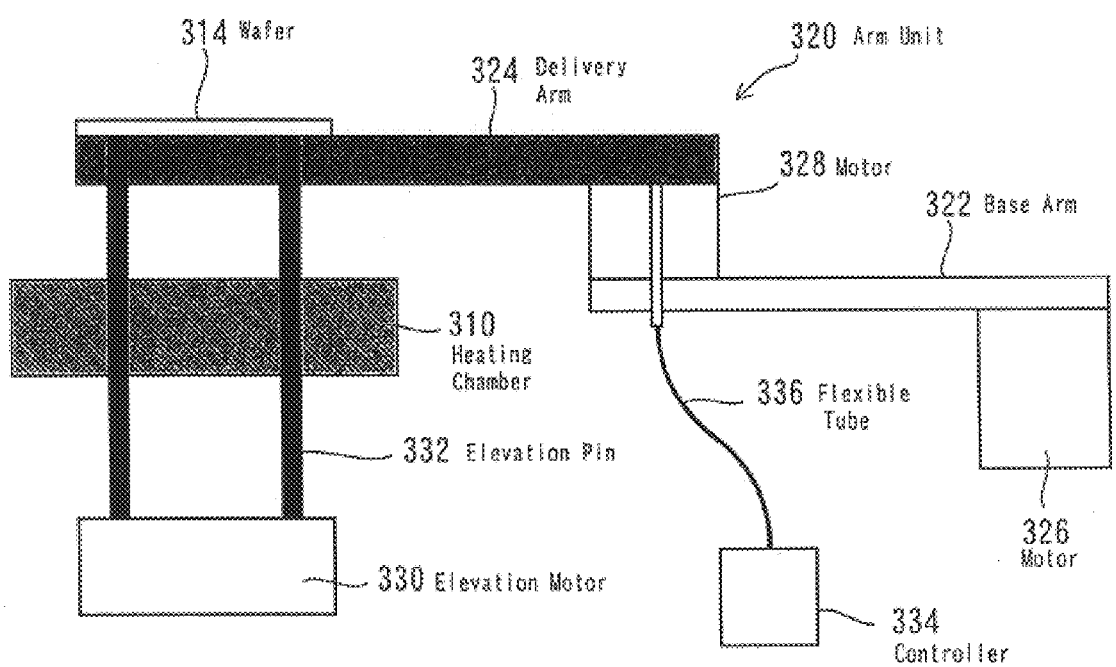
FIG. 18 is a cross-sectional view taken on line D—D in FIG. 17.

FIG. 17 depicts a sinter furnace according to a fourth preferred embodiment of the present invention. FIG. 18 shows a cross-section taken on line D—D in FIG. 17. The sinter furnace according to the fourth preferred embodiment includes a heating chamber 310, a cooling chamber 312, a conveying arm unit 320, an intermediate chamber 338, a loader cassette 316 and an un-loader cassette 318. In the heating chamber 310, a GaAs semiconductor wafer 314 is heated on a hot plate (not shown), which is kept at 450° C., in a nitrogen gas atmosphere. In the cooling chamber 312, the semiconductor wafer 314 is cooled on a cool plate (not shown), which is kept at 20° C., in a nitrogen gas atmosphere. During sintering process, the semiconductor wafer 314 is delivered by the conveying arm unit 320, which is made of SUS. In the loader cassette 316 and the un-loader cassette 318, semiconductor wafers have the room temperature of about 20° C.

The conveying arm unit 320 includes a base arm 322, a delivery arm 324 and motors 326 and 328. The motor 326 is connected to one end of the base arm 322 and turns (swings or pivots) the base arm 322 on the axis thereof. The motor 328 is connected to the other end of the base arm 322 and to one end of the delivery arm 324 and turns (swings or pivots) the delivery arm 324 on the axis thereof. The semiconductor wafer 314 is placed on the other end of the delivery arm 324. The delivery arm 324 is connected to a controller 334 via a flexible tube 336. The base arm 322 and the delivery arm 324 are driven independently from each other, so that the semiconductor wafer 314 can be delivered only by the delivery arm 324.

As shown in FIG. 18, the heating chamber 310 is provided with an elevation motor 330 and elevation pins 332. The elevation pins 332 extend vertically through the heating chamber 310 to reach the bottom surface of the semiconductor wafer 314. The elevation motor 330 drives the elevation pins 332 up and down so that the semiconductor wafer 314 is delivered between the delivery arm 324 and the hot plate (not shown) in the heating chamber 310. In the same manner as the heating chamber 310, the cooling chamber 312 is provided with an elevation motor (not shown) and elevation pins (not shown), as well.

Figure 19:
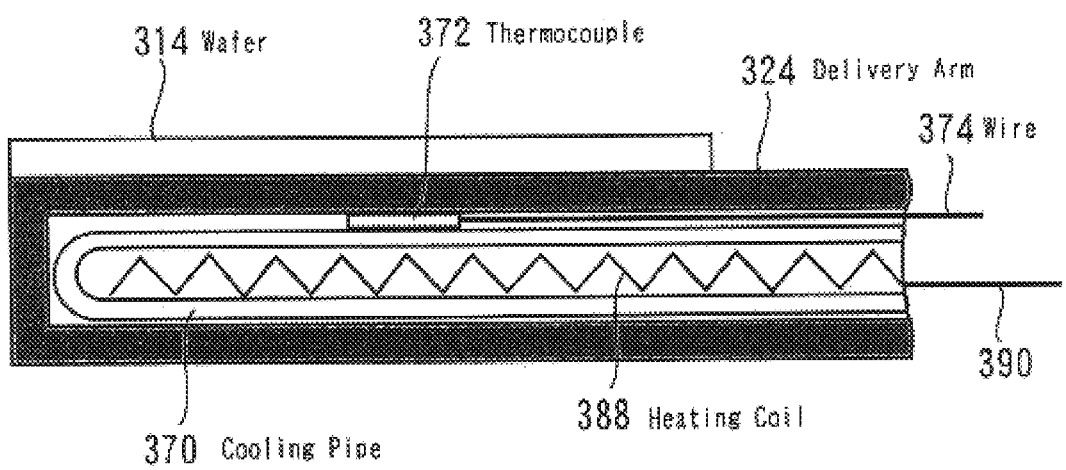
FIG. 19 is a cross-sectional view showing the inside of a delivery arm of an arm unit used in the sinter furnace of the fourth preferred embodiment.

FIG. 19 shows the inside structure of the delivery arm 324 of the conveying arm unit 320 according to the fourth preferred embodiment of the present invention. The delivery arm 324 is provided therein with a heating coil 388, a cooling pipe 370 and a thermocouple 372. The heating coil 388 is connected via a flexible wire 390 to the controller 334, shown in FIG. 18. The ends of the cooling pipe 370 are connected via the flexible tube 336 to the controller 334. The thermocouple 372 is connected via a flexible wire 374 to the controller 334. The flexible wires 374 and 390, and the cooling pipe 370 are included in the flexible tube 336 so that the flexible wires 374 and 390 and the cooling pipe 370 do not block the passage of the base arm 322 and the delivery arm 324.

The heating coil 388 generates heat in response to electric current supplied from the controller 334 through the flexible wire 390, so that the delivery arm 324 can be heated to 450° C. The thermocouple 372 detects the temperature of the delivery arm 324 and supplies the corresponding output signal to the controller 334 through the flexible wire 374. In response to the output signal of the thermocouple 372, the controller 334 controls the amount of current to be supplied through the flexible wire 390 to the heating coil 388, so that the delivery arm 324 is controlled at an optimum temperature.

Cooling liquid, such as water, travels in the cooling pipe 370 so that the delivery arm 324 can be controlled in temperature to about 20° C. In response to the output signal of the thermocouple 372, the controller 334 controls the temperature of the cooling liquid traveling in the cooling pipe 370, so that the delivery arm 324 is controlled at an optimum temperature.

The controller 334 selectively operates a current source (not shown), supplying electric current to the heating coil 388, and a pump (not shown), supplying the cooling liquid to the cooling pipe 370. In other words, the controller 334 controls the delivery arm 324 to have the optimum temperature all the time during delivery of the semiconductor wafer 314.

FIG. 20 shows the temperature variation of the semiconductor wafer 314, which is processed in the sinter furnace according to the fourth preferred embodiment of the present invention.

In operation, first, the delivery arm 324 of the conveying arm unit 320 delivers the semiconductor wafer 314 from the loader cassette 316 to the intermediate chamber 338. When the semiconductor wafer 314 is put on the delivery arm 324, the delivery arm 324 is controlled in temperature at 20° C., corresponding to the current temperature of the semiconductor wafer 314. In other words, there is no temperature difference between the semiconductor wafer 314 and the delivery arm 324. Once the semiconductor wafer 314 is set on the delivery arm 324, the controller 334 starts operating the heating coil 388 to control the temperature of the delivery arm 324 until 150° C., which is corresponding to the temperature in the intermediate chamber 338. In the intermediate chamber 338, the semiconductor wafer 314 is controlled in temperature at 150° C. in a nitrogen gas atmosphere for five minutes.

Next, the delivery arm 324 delivers the semiconductor wafer 314 from the intermediate chamber 338 to the heating chamber 310. When the semiconductor wafer 314 is put on the delivery arm 324, the delivery arm 324 has been controlled in temperature at 150° C., which is corresponding to the current temperature of the semiconductor wafer 314. During the delivery from the intermediate chamber 338 to the heating chamber 310, the controller 334 operates the heating coil 388 to control the temperature of the delivery arm 324 until 450° C., which is corresponding to the temperature in the heating chamber 310. Thus, no temperature difference is made when the semiconductor wafer 314 is delivered in the heating chamber 310. In the heating chamber 310, the semiconductor wafer 314 is heated on the hot plate (not shown) in a nitrogen gas atmosphere for five minutes.

After the heating treatment, the delivery arm 324 delivers the semiconductor wafer 314 to the intermediate chamber 338. When the semiconductor wafer 314 of 450° C. is put on the delivery arm 324, the delivery arm 324 has been controlled at 450° C. During the delivery between the heating chamber 310 and the intermediate chamber 338, the controller 334 operates the cooling system (370) to control the temperature of the delivery arm 324 until 150° C., which is corresponding to the temperature in the intermediate chamber 338. In the intermediate chamber 338, the semiconductor wafer 314 is controlled in temperature at 150° C. in a nitrogen gas atmosphere for five minutes.

After the intermediate treatment, the delivery arm 324 delivers the semiconductor wafer 314 to the cooling chamber 312. When the semiconductor wafer 314 is placed on the delivery arm 324, the delivery arm 324 has been controlled in temperature at 150° C., which is corresponding to the current temperature of the semiconductor wafer 314. During the delivery between the intermediate chamber 338 and the cooling chamber 312, the controller 334 controls the temperature of the delivery arm 324 until 20° C., which is corresponding to the temperature in the cooling chamber 312. In the cooling chamber 312, the semiconductor wafer 314 is cooled on the cool plate (not shown) at 20° C. in a nitrogen gas atmosphere for five minutes.

After the cooling treatment, the semiconductor wafer 314 is delivered to the un-loader cassette 318. When the semiconductor wafer 314 is set on the delivery arm 324, the delivery arm 324 has been controlled in temperature at 20° C., which is corresponding to the current temperature of the semiconductor wafer 314.

As described above, according to the fourth preferred embodiment of the present invention, the delivery arm 324 is controlled to have the same temperature as the semiconductor wafer 314 every time when those are touch with each other. In other words, no temperature difference is made between the semiconductor wafer 314 and the delivery arm 324. Therefore, it is prevented that the semiconductor wafer 314 is broken due to heat-shock (rapid heating) or cool-shock (rapid cooling).

It will be understood that the above description of the present invention is susceptible to various modifications, changes and adaptations, and the same are intended to be comprehended with the meaning and range of equivalents of the appended claims.

The present invention is applicable not only to a single wafer processing type, but also, to a batch processing type of sinter furnace. The present invention is applicable not only to a sinter furnace, but also, to a CVD apparatus, a dry-etching apparatus, and the like.

What is claimed is:

1. A method of fabricating a semiconductor device comprising:

thermally treating a semiconductor wafer with a wafer treatment device;

delivering the semiconductor wafer into the wafer treatment device using a conveyor; and controlling a temperature of the conveyer using a cooling element and a heating element disposed within the conveyor, the conveyor having a first arm and a second arm connected to the first arm, the second arm being independently movable with respect to the first arm and having the cooling element and the heating element therein, the semiconductor wafer being conveyed as in contact with the second arm.

2. The method according to claim 1, wherein the semiconductor wafer is heated by the wafer treatment device.

3. The method according to claim 2, wherein the conveyer is heated so as to decrease a temperature difference between the semiconductor wafer and the conveyor, and a surface inside the wafer treatment device.

4. The method according to claim 1, wherein the semiconductor wafer is cooled by the wafer treatment device.

5. The method according to claim 4, wherein the conveyer is cooled so as to decrease a temperature difference between the semiconductor wafer and the conveyor, and a surface inside the wafer treatment device.

6. The method according to claim 1, further comprising transferring the thermally treated wafer from the wafer treatment device using the temperature controlled conveyor.

7. The method according to claim 6, wherein said controlling the temperature of the conveyor comprises heating the conveyor while delivering the semiconductor wafer to the wafer treatment device and cooling the conveyor while transferring the thermally treated wafer from the wafer treatment device.

8. The method according to claim 1, wherein the wafer treatment device includes a heating chamber, a cooling chamber and an intermediate chamber, the method further comprising conveying the semiconductor wafer between the heating, cooling and intermediate chambers using the conveyor.

9. The method according to claim 8, wherein when the semiconductor wafer is to be conveyed between the heating and cooling chambers, the semiconductor wafer is first transferred to the intermediate chamber so as not to be directly transferred between the heating and cooling chambers.

10. The method according to claim 1, wherein the wafer treatment device includes a heating chamber and a cooling chamber, the method further comprising conveying the semiconductor wafer between the heating and cooling chambers using the conveyor.

11. A method of fabricating a semiconductor device comprising:

controlling a temperature of a first conveyor, the first conveyor having a first arm and a second arm connected to the first arm, the second arm being independently movable with respect to the first arm and having a heating element therein;

delivering a semiconductor wafer to a wafer treatment device using the temperature controlled first conveyer, the semiconductor wafer being conveyed as in contact with the second arm;

thermally treating the semiconductor wafer in the wafer treatment device;

controlling a temperature of a second conveyor, the second conveyor having a first arm and a second arm connected to the first arm of the second conveyor, the second arm of the second conveyor being independently movable with respect to the first arm of the second conveyor and having a cooling element therein; and transferring the thermally treated semiconductor wafer from the wafer treatment device using the temperature controlled second conveyor, the thermally treated semiconductor wafer being conveyed as in contact with the second arm of the second conveyor, wherein said controlling of the temperature of the first conveyor comprises heating the first conveyor with the heating element and said controlling of the temperature of the second conveyor comprises cooling the second conveyor with the cooling element.

12. The method according to claim 11, wherein the wafer treatment device includes a heating chamber and a cooling chamber, the method further comprising conveying the semiconductor wafer between the heating and cooling chambers using the first and second conveyors.

13. The method according to claim 11, wherein the wafer treatment device includes a heating chamber, a cooling chamber and an intermediate chamber, the method further comprising conveying the semiconductor wafer between the heating, cooling and intermediate chambers using the first and second conveyors.

14. The method according to claim 13, wherein when the semiconductor wafer is to be conveyed between the heating and cooling chambers, the semiconductor wafer is first transferred to the intermediate chamber so as not to be directly transferred between the heating and cooling chambers.

15. A method of fabricating a semiconductor device comprising:

controlling a temperature of a first conveyor, the first conveyor having a first arm and a second arm connected to the first arm, the second arm being independently movable with respect to the first arm and having a cooling element therein;

delivering a semiconductor wafer to a wafer treatment device using the temperature controlled first conveyer, the semiconductor wafer being conveyed as in contact with the second arm;

thermally treating the semiconductor wafer in the wafer treatment device;

controlling a temperature of a second conveyor, the second conveyor having a first arm and a second arm connected to the first arm of the second conveyor, the second arm of the second conveyor being independently movable with respect to the first arm of the second conveyor and having a heating element therein; and transferring the thermally treated semiconductor wafer in the wafer treatment device using the temperature controlled first conveyor, the thermally treated semiconductor wafer being conveyed as in contact with the second arm of the second conveyor, wherein said controlling of the temperature of the first conveyor comprises cooling the first conveyor with the cooling element and said controlling of the temperature of the second conveyor comprises heating the second conveyor with the heating element.

16. The method according to claim 15, wherein the wafer treatment device includes a heating chamber and a cooling chamber, the method further comprising conveying the semiconductor wafer between the heating and cooling chambers using the first and second conveyors.

17. The method according to claim 15, wherein the wafer treatment device includes a heating chamber, a cooling chamber and an intermediate chamber, the method further comprising conveying the semiconductor wafer between the heating, cooling and intermediate chambers using the first and second conveyors.

18. The method according to claim 17, wherein when the semiconductor wafer is to be conveyed between the heating and cooling chambers, the semiconductor wafer is first transferred to the intermediate chamber so as not to be directly transferred between the heating and cooling chambers.

* * * * *